(12) United States Patent
Doyle et al.

(10) Patent No.: US 9,793,467 B2
(45) Date of Patent: Oct. 17, 2017

(54) METHOD FOR REDUCING SIZE AND CENTER POSITIONING OF MAGNETIC MEMORY ELEMENT CONTACTS

(75) Inventors: Brian S. Doyle, Portland, OR (US); Yong Ju Lee, Sunnyvale, CA (US); Charles C. Kuo, Hillsboro, OR (US); David L. Kencke, Beaverton, OR (US); Kaan Oguz, Hillsboro, OR (US); Roksana Golizadeh Mojard, San Jose, CA (US); Uday Shah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 249 days.

(21) Appl. No.: 13/996,530

(22) PCT Filed: Dec. 20, 2011

(86) PCT No.: PCT/US2011/066015
§ 371 (c)(1),
(2), (4) Date: Mar. 5, 2014

(87) PCT Pub. No.: WO2013/095357
PCT Pub. Date: Jun. 27, 2013

(65) Prior Publication Data
US 2014/0167191 A1    Jun. 19, 2014

(51) Int. Cl.
*H01L 29/82*  (2006.01)
*H01L 43/02*  (2006.01)
(Continued)

(52) U.S. Cl.
CPC ............ *H01L 43/02* (2013.01); *H01L 27/222* (2013.01); *H01L 43/12* (2013.01)

(58) Field of Classification Search
CPC .......... H01L 43/08; H01L 43/10; H01L 29/82
(Continued)

(56) References Cited

U.S. PATENT DOCUMENTS 5,610,419 A * 3/1997 Tanaka ................. H01L 27/115
257/301
5,963,818 A * 10/1999 Kao ................. H01L 21/28123
257/330
(Continued)

FOREIGN PATENT DOCUMENTS

JP    2006-295198 A    10/2006
TW    200614232 A     5/2006
(Continued)

OTHER PUBLICATIONS

Notice of Preliminary Rejection (Non-Final) from the Korean Intellectual Property Office (KIPO) dated Sep. 16, 2015 for Korean Patent Application No. 10-2014-7017411 and English Summary thereof.
(Continued)

*Primary Examiner* — Brook Kebede
(74) *Attorney, Agent, or Firm* — Schwabe, Williamson & Wyatt P.C.

(57) ABSTRACT

A method of centering a contact on a layer of a magnetic memory device. In one embodiment, a spacers is formed in an opening surrounding the upper layer and the contact is formed within the spacer. The spacer is formed from an anisotropically etched conformal layer deposited on an upper surface and into the opening.

7 Claims, 22 Drawing Sheets

(51) Int. Cl.
  *H01L 43/12* (2006.01)
  *H01L 27/22* (2006.01)
(58) Field of Classification Search
  USPC ............................. 438/3; 257/421, E43.001
  See application file for complete search history.

(56) References Cited

U.S. PATENT DOCUMENTS

| | | | |
|---|---|---|---|
| 6,114,719 | A | 9/2000 | Dill et al. |
| 6,985,384 | B2 | 1/2006 | Costrini et al. |
| 7,579,197 | B1 * | 8/2009 | Li .......................... H01L 43/08 257/E21.665 |
| 2004/0063223 | A1 | 4/2004 | Costrini et al. |
| 2004/0211749 | A1 * | 10/2004 | Grynkewich ......... B82Y 10/00 216/2 |
| 2006/0019487 | A1 * | 1/2006 | Leuschner ............. G11C 11/16 438/637 |
| 2009/0209050 | A1 | 8/2009 | Wang et al. |
| 2009/0227045 | A1 * | 9/2009 | Li .......................... H01L 43/08 438/3 |
| 2011/0117677 | A1 | 5/2011 | Yuan et al. |
| 2011/0121417 | A1 | 5/2011 | Li et al. |
| 2011/0204459 | A1 | 8/2011 | Gaidis |

FOREIGN PATENT DOCUMENTS

| | | |
|---|---|---|
| TW | 200715283 A | 5/2007 |
| TW | 200737184 A | 10/2007 |
| TW | I311758 | 7/2009 |
| TW | 201032369 A | 9/2010 |
| TW | 201106468 A | 2/2011 |
| TW | 201108482 A | 3/2011 |
| TW | 201131847 A | 9/2011 |
| TW | 201140580 A | 11/2011 |

OTHER PUBLICATIONS

Official Letter and Search Report from the Taiwan IP Office dated Sep. 9, 2015 and English Translation of the Search Report.
International Search Report dated Sep. 10, 2012 for PCT/US2011/066015, filed Dec. 20, 2011, 3 pages.
Office Action from the Chinese Patent Office dated Mar. 29, 2016 for Chinese Patent Application No. 201180075558.0.
Second Office Action (3 pages) from the Chines Patent Office dated Nov. 16, 2016 for Chinese Patent Application No. 201180075558.0.
Notice of Allowance (2 pages) from the Taiwan Patent Office dated Oct. 19, 2016 for Taiwan Patent Application No. 101142615 and English Translation (1 page) thereof.
Notice of Allowance from the Korean Intellectual Property Office (KIPO) dated Jan. 26, 2016 for Korean Patent Application No. 10-2014-7017411.

* cited by examiner

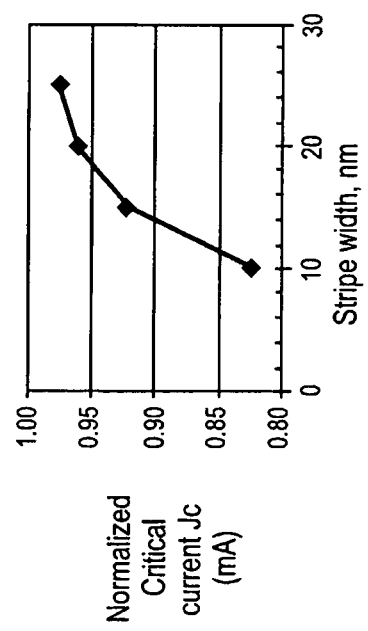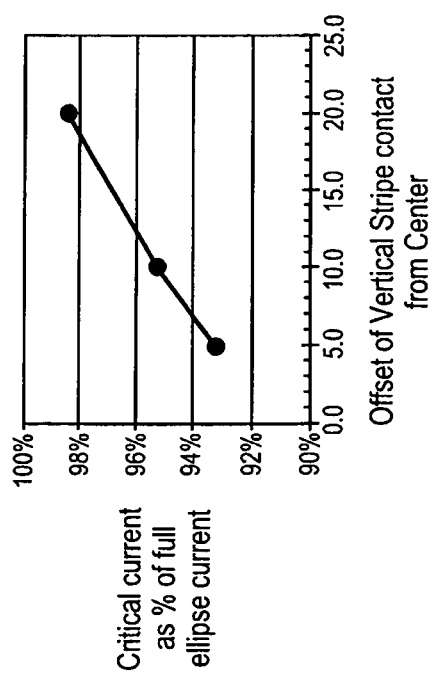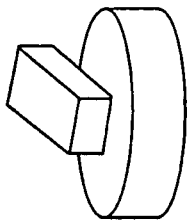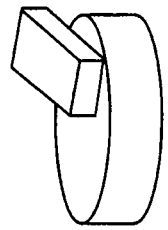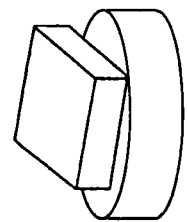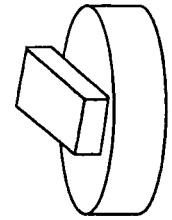

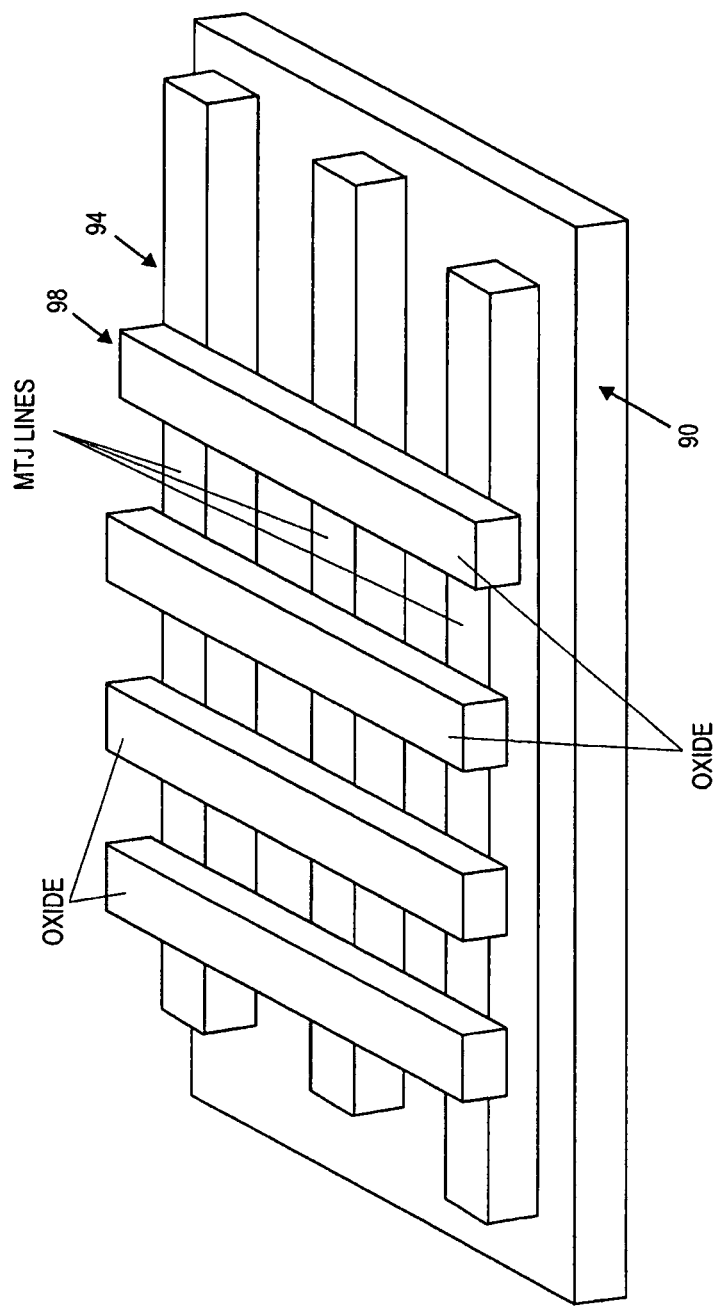

US 9,793,467 B2

METHOD FOR REDUCING SIZE AND CENTER POSITIONING OF MAGNETIC MEMORY ELEMENT CONTACTS

CROSS-REFERENCE TO RELATED APPLICATION

This patent application is a U.S. National Phase Application under 35 U.S.C. §371 of International Application No. PCT/US2011/066015, filed Dec. 20, 2011, entitled METHOD FOR REDUCING SIZE AND CENTER POSITIONING OF MAGNETIC MEMORY ELEMENT CONTACTS.

FIELD OF THE INVENTION

The invention relates to the field of memory contacts particularly for magnetic memories.

PRIOR ART AND RELATED ART

Among magnetic memories are those employing a magnetic tunneling junction (MTJ) device having a fixed or pinned layer and a free layer as described in "Current Switching in MgO-Based Magnetic Tunneling Junctions," *IEEE Transactions on Magnetics*, Vol. 47, No. 1, January 2011 (beginning at page 156) by Zhu, et al. The direction of magnetization in the free layer is switched from one direction to another through spin torque transfer using a spin-polarized current. This direction determines whether an MTJ device is storing a 1 or a 0. Reducing the current needed to reorient the magnetic direction in the free layer (during a write cycle) is significant for commercial purposes. See, "Write Current Reduction in Spin Transfer Torque Memory Devices," Ser. No. 12/971,977, filed on Dec. 17, 2010, assigned to the assignee of the present application.

BRIEF DESCRIPTION OF THE DRAWINGS

FIG. 1A is a graph illustrating the current (normalized current) needed to switch the magnetic direction in a free layer of an MTJ device vs. the contact size.

FIG. 1B is a perspective view showing a first contact strip engaging the free layer in an MTJ device.

FIG. 1C is a perspective view showing a contact smaller than the contact of FIG. 1B engaging the free layer in an MTJ device.

FIG. 2A is a graph showing the effect of having an off-center contact to a free layer in an MTJ cell.

FIG. 2B is a perspective view of a contact centered on the free layer in a MTJ device.

FIG. 2C is a perspective view of an off-center contact on a free layer in an MTJ device.

FIG. 21B is a perspective view generally showing the structure of FIG. 21A without protective spacers.

DETAILED DESCRIPTION

A method for fabricating contacts to MTJ devices is described. In the following description, numerous specific details are set forth such as specific dimensions and materials, in order to provide a thorough understanding of the present invention. It will be apparent to one skilled in the art, that the present invention may be practiced without these specific details. In other instances, well-known processes are not described in detail to avoid unnecessarily obscuring the present invention.

A current density in the order of 1-3 M amps/cm$^2$ is typically required to switch the magnetic direction in the free layer of an MTJ device. The total current can be reduced by reducing the size of the free layer. Also, the free layer can be switched even though the required current density occurs only in a portion of the layer. FIGS. 1B and 1C illustrate a contact to the free layer in an MTJ device. The contact of FIG. 1C is narrower than the contact of FIG. 1B. The graph of FIG. 1A demonstrates the normalized total current needed to switch the state of the free layer as a function of contact width. As illustrated, the current needed to switch the direction to the device can be reduced simply by using a narrower contact strip.

One limitation on reducing the width of the contact strip is the necessity that the strip be centered on the layer. FIG. 2B has a contact strip centered on the layer while FIG. 2C has one off-center. The graph of FIG. 2A demonstrates the effective increase in critical current resulting from the contact strip not being centered for an elliptically-shaped MTJ device. This graph and the graph of FIG. 1A demonstrate that the reduction of current gained by narrowing the width of the contact can be lost by having the contact off-center. As will be described below, the described processes assure that the contact is both smaller and centered.

Figure 3:
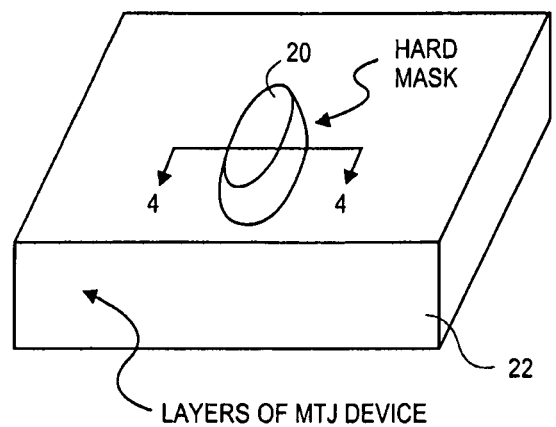
FIG. 3 is a perspective view of a hard mask disposed on a substrate having a plurality of layers used in the formation of an MTJ device.

In the formation of an MTJ device several layers 22 (FIG. 3) of the material of the MTJ device are etched using a mask such as the hard mask. The devices are typically small (e.g., 40×80 nm). And in the forming of a masking member of this dimension, the square corners are often rounded giving way to an elliptically shaped device, as in FIG. 3.

Figure 4:
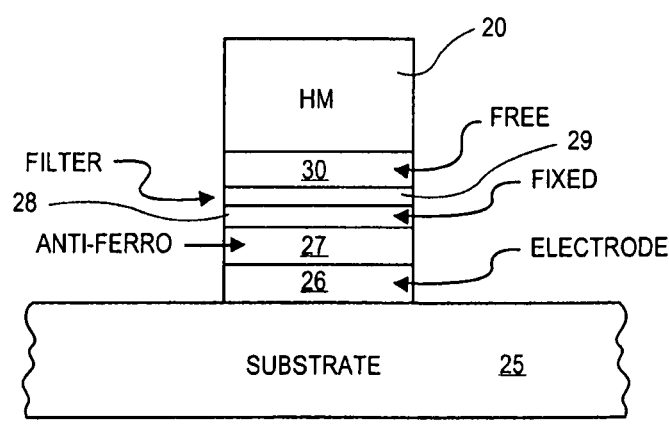
FIG. 4 is a cross-sectional elevation view, taken through section line 4-4 of FIG. 3, showing the layers in an MTJ device after etching in alignment with the hard mask of FIG. 3.

In FIG. 4 and other figures in this application, the formation of one or two MTJ devices on a substrate such as substrate 25 is described. As will be appreciated in practice, many devices are simultaneously formed on a single substrate. Moreover, other parts of a memory, such as select transistors connected to the lower electrodes of the devices are formed on the substrate along with memory array circuits and interconnecting lines, including sensing circuits and decoding circuits. Additionally, the MTJ layers may be deposited over an entire substrate or only in selected portions of the substrate where the devices are embedded in a larger structure.

In a typical design an MTJ device includes a bottom electrode 26 (FIG. 4) which itself may have several different metals such as ruthenium, copper nitride, titanium and tantalum; an anti-ferromagnetic layer 27; a fixed magnetic layer 28 pinned by the strength of layer 28; a filter layer 29 such as an MgO layer; and, a free magnetic layer 30. The specific number of layers, their composition and thicknesses are not critical to the present application, rather the present application is directed to fabricating a contact to the layer 30 or an electrode layer disposed on the layer 30. In a typical device, the bottom electrode contacts vias extending down to the interconnect system below.

Figure 5A:
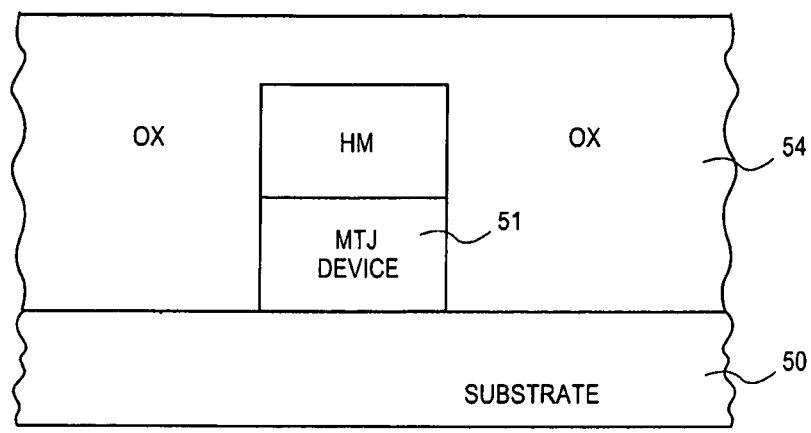
FIG. 5A shows the structure of FIG. 4 after the formation of a surrounding oxide layer.
Figure 5B:
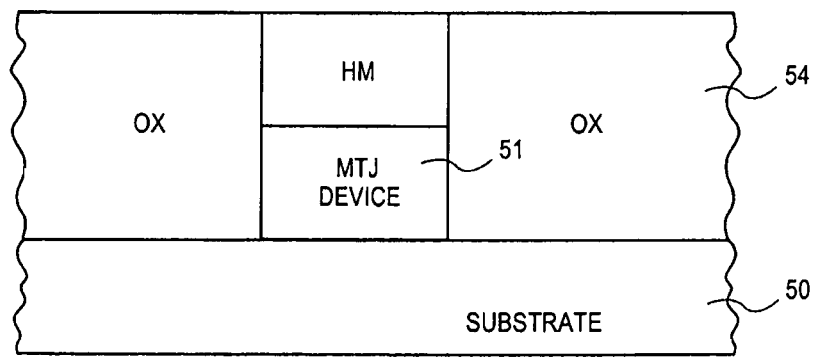
FIG. 5B shows the structure of FIG. 5A after planarization.
Figure 5C:
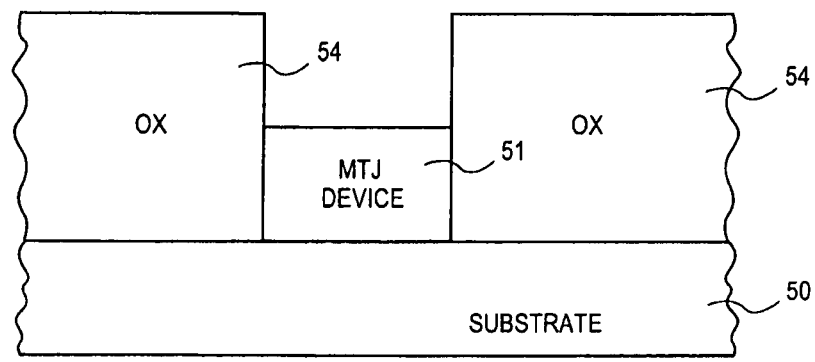
FIG. 5C shows the structure of FIG. 5B after removal of the hard mask.
Figure 5D:
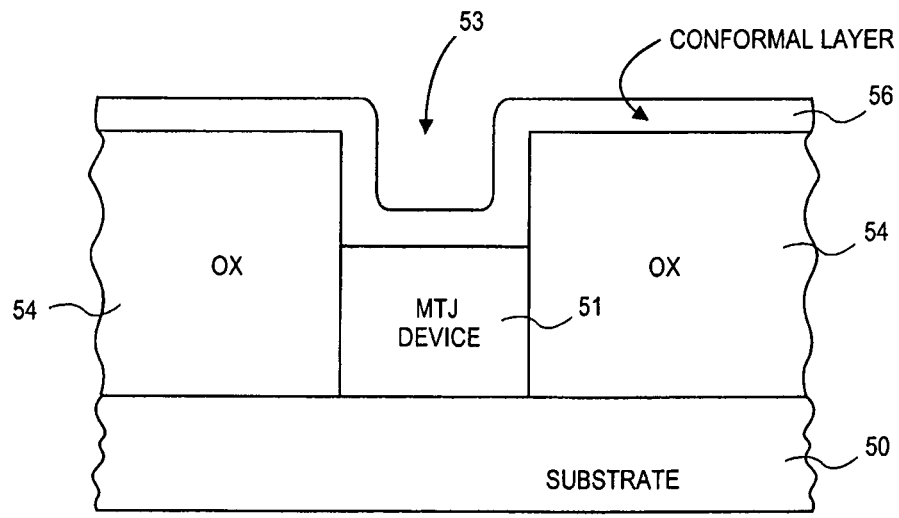
FIG. 5D shows the structure of FIG. 5C after deposition of a conformal layer.

Referring now to FIG. 5A, an MTJ device 51 is formed on substrate 50 using a hard mask. A silicon dioxide (oxide) layer 54 or other insulation is deposited and planarized (FIG. 5B) to the upper surface of the hard mask. Then the hard mask material is removed (FIG. 5C) and a conformal layer 56 is deposited on the upper surface of the oxide 54 and into the opening 53 (FIG. 5D). By way of example, the layer 56 may have a thickness of 5-20 nm and may be silicon nitride or a metal. The conformal layer 56 and the other conformal layers discussed below are selected such that they can be etched without etching the underlying layers such as the OX layer 54.

Figure 6:
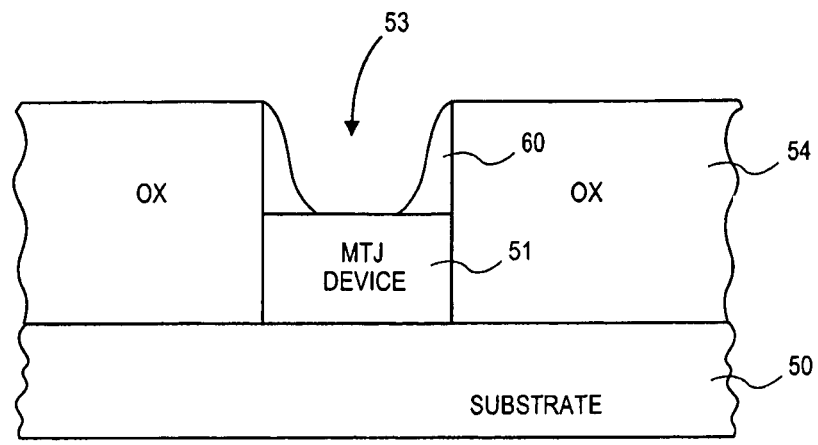
FIG. 6 illustrates the structure of FIG. 5 after an anisotropic etching step used to define a spacer.

Next, an anisotropic etching step is used to etch the layer 56 (of FIG. 5D), for instance with a reactive ion etching step. This results in the spacer 60 (FIG. 6) which lines the entire opening 53. Where the opening 53 is elliptical in shape and has nominal dimensions of 40×80 nm, and the spacer a width of 5-20 nm at its bottom, the exposed area at the upper surface of the MTJ device 51 is elliptical in shape. The nominal dimensions of the exposed upper surface is 20×60 nm versus the 40×80 nm of the entire upper surface of the MTJ device where the spacer has a thickness of 10 nm. Moreover, the opening 53 and the exposed upper surface of the MTJ device 51 is precisely centered on the upper layer of the device 51.

Figure 7:
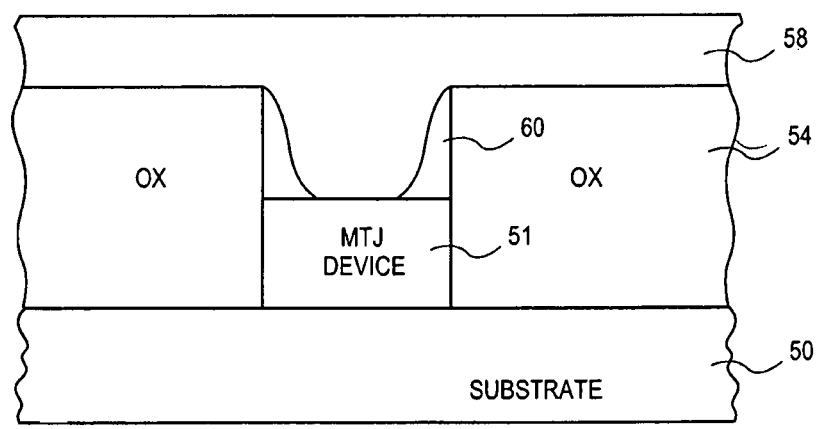
FIG. 7 illustrates the structure of FIG. 6 following the deposition of a metal layer forming a contact for the MTJ device.
Figure 8:
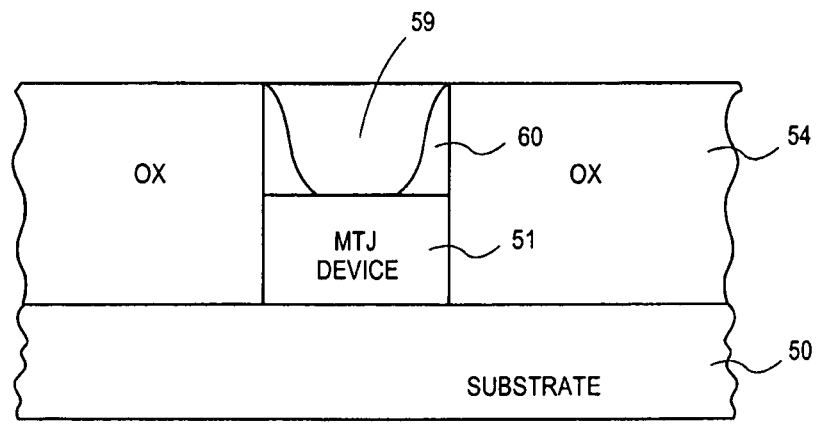
FIG. 8 illustrates the structure of FIG. 7 following planarization.

Next, a conformal metal fill 58 is deposited as shown in FIG. 7. This is followed by a metal polishing step leaving a metal plug 59 (FIG. 8). Here not only is the plug's size well defined, it is centered on the upper layer of the device 51.

Figure 9:
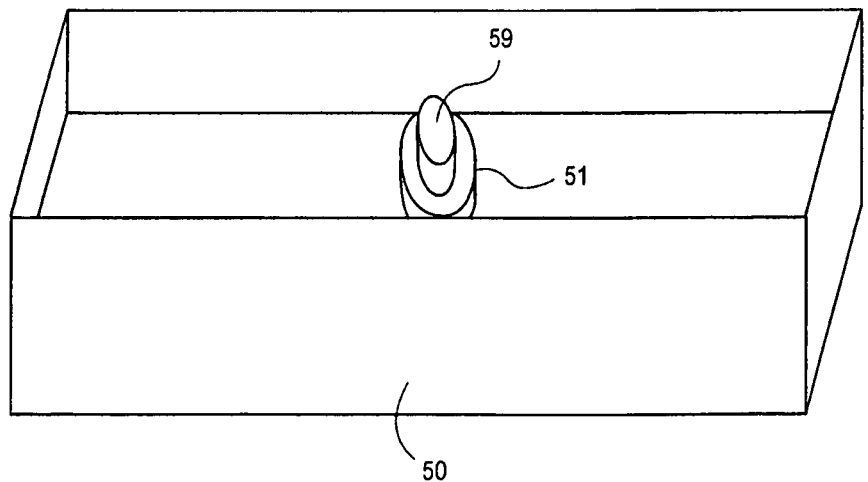
FIG. 9 is a perspective view showing the contact formed in FIG. 7 after removal of the spacer.

FIG. 9 illustrates the MTJ device with the spacer and ILD removed for clarity to show not only the contact's relative size to device 51 but also that the plug/contact 59 is centered on the upper layer of device 51.

Figure 10:
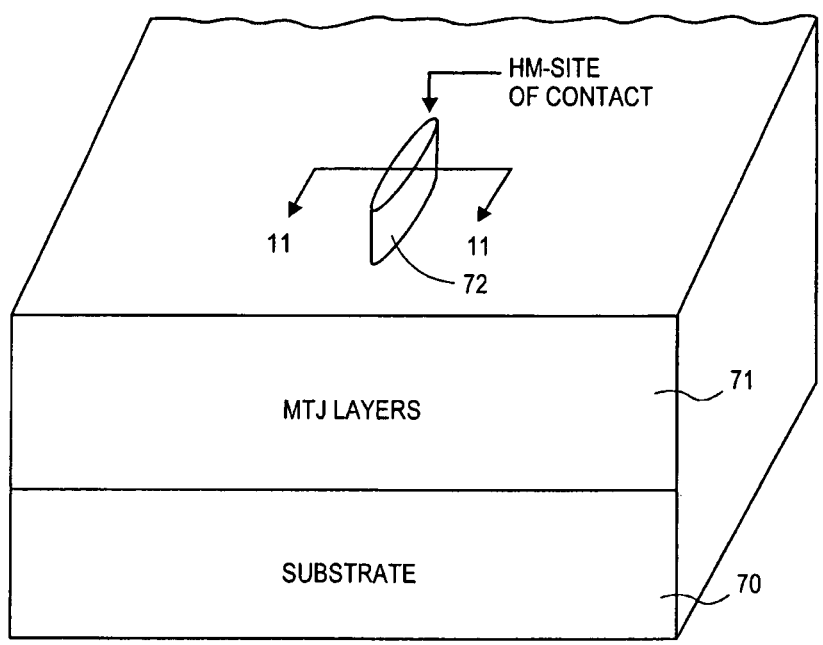
FIG. 10 is a perspective view showing a hard mask disposed on MTJ layers where the hard mask defines a contact to an MTJ device.
Figure 11:
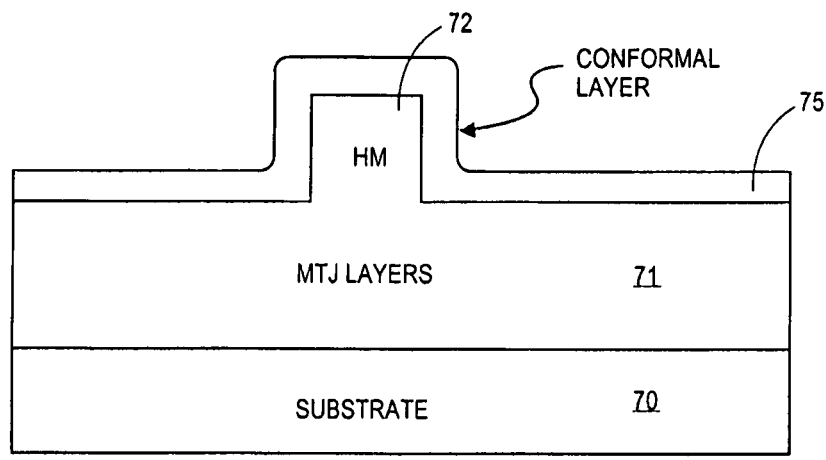
FIG. 11 is a cross-sectional elevation view, taken through section lines 11-11 of FIG. 10, after a conformal layer is formed over the upper surface of the MTJ layers and the hard mask of FIG. 10.
Figure 12:
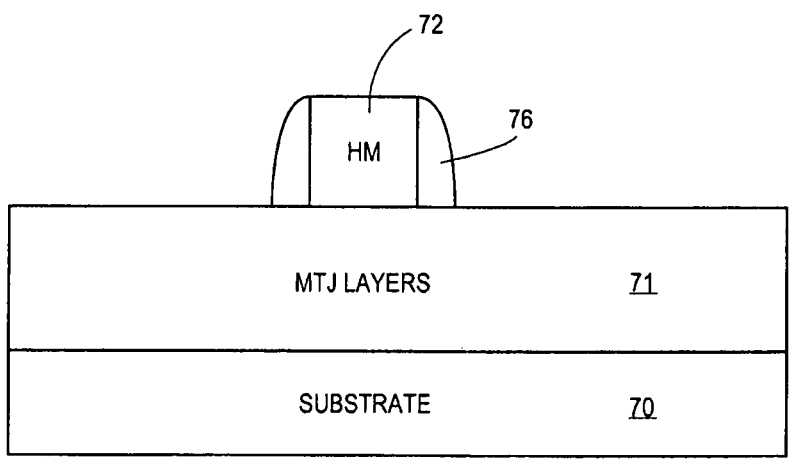
FIG. 12 illustrates the structure of FIG. 11 following an anisotropic etching step forming a spacer on the hard mask of FIG. 11.

In the alternate processing of FIG. 10, a hard mask 72, equal in size to the desired contact (not the size of the upper layer of an MTJ device), is formed on the MTJ layers 71 of a substrate 70. Next, as shown in FIG. 11 a conformal layer 75 is deposited over the upper surface of the MTJ layers 71 and over the hard mask 72. Note that FIG. 11 is taken through the cross-section lines 11-11 of FIG. 10. Now, using an anisotropic etching step the spacers 76 are formed around the hard mask 72 as shown in FIG. 12.

Figure 13:
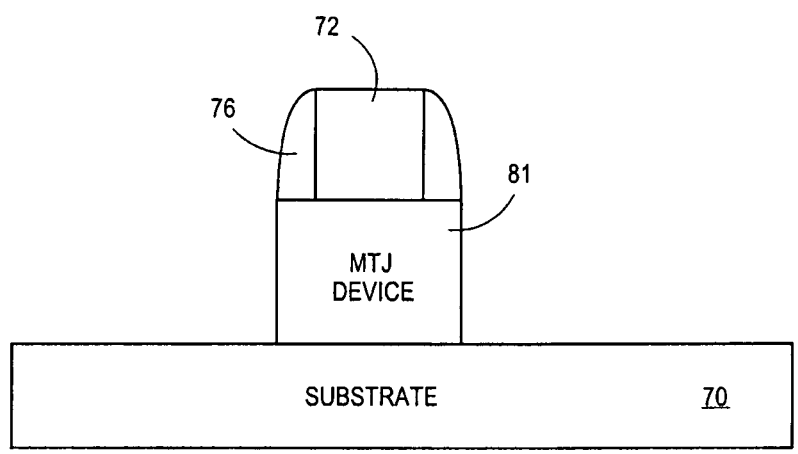
FIG. 13 shows the structure of FIG. 12 following the etching of the MTJ device.

Then as shown in FIG. 13, the MTJ layers are etched in alignment with the spacer 76 resulting in the MTJ device 81 being formed on the substrate 70.

Figure 14A:
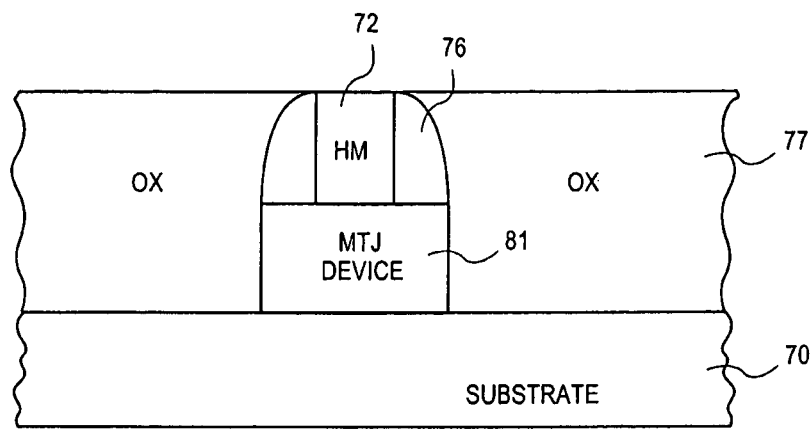
FIG. 14A illustrates the structure of FIG. 13 following the formation of an oxide layer and its planarization.
Figure 14B:
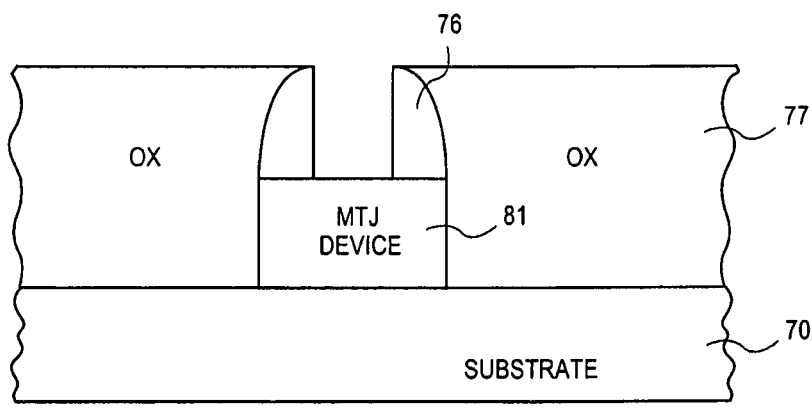
FIG. 14B shows the structure of FIG. 14A after removal of the hard mask.
Figure 14C:
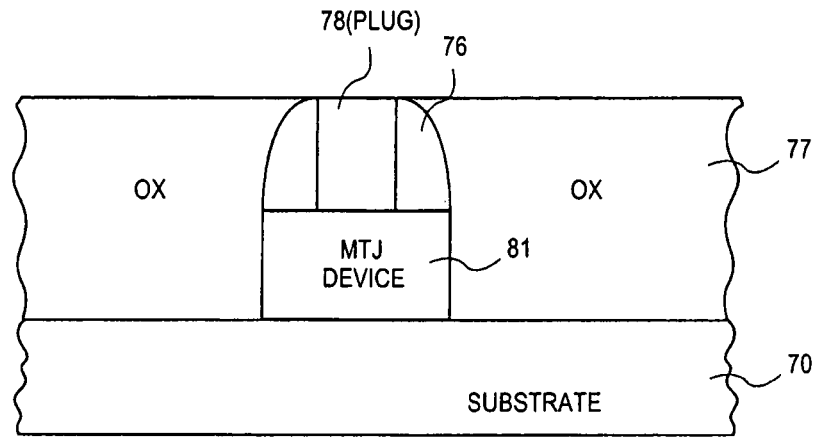
FIG. 14C shows the structure FIG. 14B following formation of a contact.

Following the formation of the MTJ device 81, an oxide 77 is formed over the substrate and planarized to provide the structure shown in FIG. 14A. This is followed by the removal of the hard mask 72 of FIG. 14A, as shown in FIG. 14B. Then as shown in FIG. 14C, a metal layer is deposited and planarized to form the plug or contact 78 of FIG. 14C.

Figure 15A:
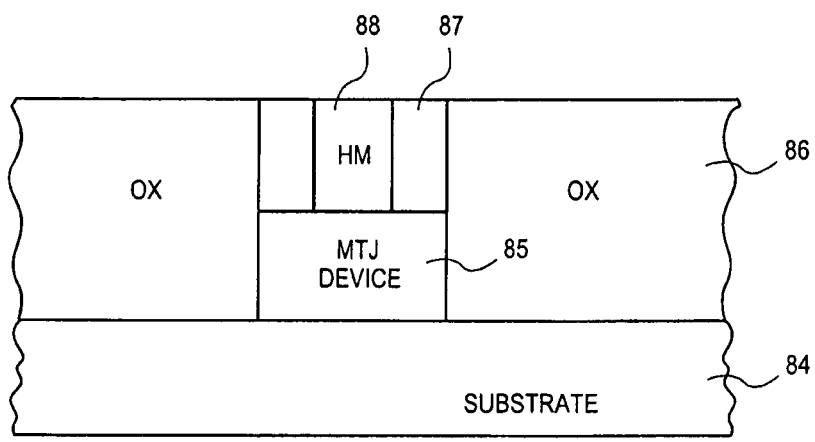
FIG. 15A illustrates alternate processing beginning with the structure of FIG. 14A.
Figure 15B:
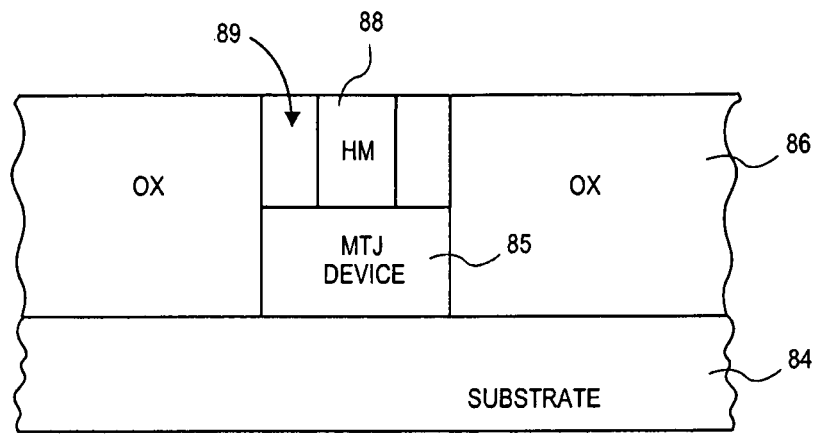
FIG. 15B illustrates the structure of FIG. 15A following removal of the spacer.
Figure 15C:
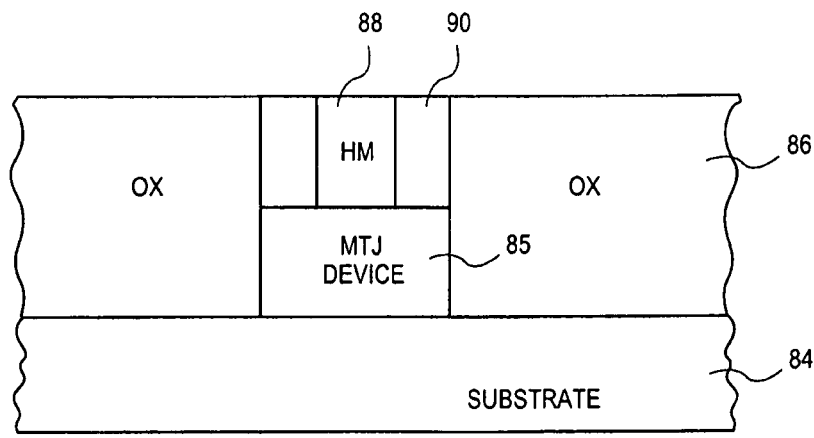
FIG. 15C illustrates the structure of FIG. 15B following the formation of a contact surrounding the hard mask.
Figure 15D:
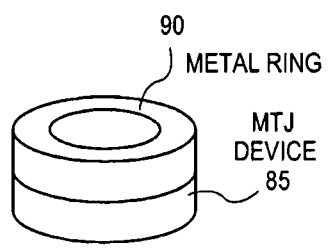
FIG. 15D is a perspective view of the MTJ device and its contact of FIG. 15C.

Another alternate process begins with the structure shown in FIG. 14A, and reproduced in FIG. 15A. Here, the substrate 84 includes an MTJ device 85, a hard mask 88 surrounded by a spacer 87. The MTJ device, hard mask and spacer 87 are surrounded by a planarized oxide layer 86. Next, as shown in FIG. 15B, the spacer is removed leaving the hard mask 88 centrally disposed on the upper surface of the MTJ device 85 surrounded by the opening 89. Now, a metal layer is deposited and planarized forming a contact 90 on the upper surface of the MTJ device 85. The contact shown as a metal ring has a generally annular shape best seen in the perspective view of FIG. 15D. The metal ring provides a contact to the MTJ device and thus provides the same functionality as, for instance, the contact 78 of FIG. 14C.

Figure 16:
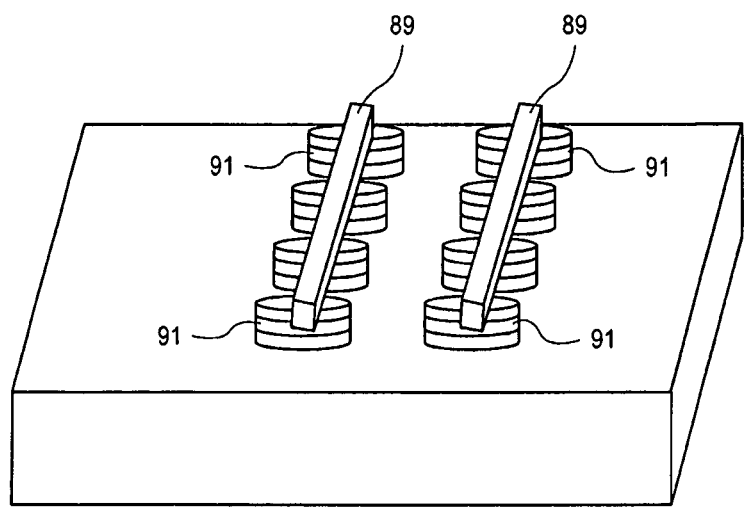
FIG. 16 is a perspective view showing a partial array of MTJ devices interconnected by contact lines.

In the prior embodiments, the method described the fabricating of a contact with defined size, centered on the upper layer of an MTJ device. The remaining figures describe the fabrication of an array with lines 89 centered on a plurality of MTJ devices 91 such as shown in FIG. 16. Once again, the substrate upon which the MTJ devices are fabricated typically includes select transistors allowing a single one of the devices to be selected for reading or writing, as well as additional circuitry such as the sensing circuits and address decoders. As will be seen in the following figures, first the array lines are defined and used along with spacers to define one dimension of the MTJ devices. Then, after a subsequent lithography step, the second dimension of the MTJ devices is defined.

Figure 17:
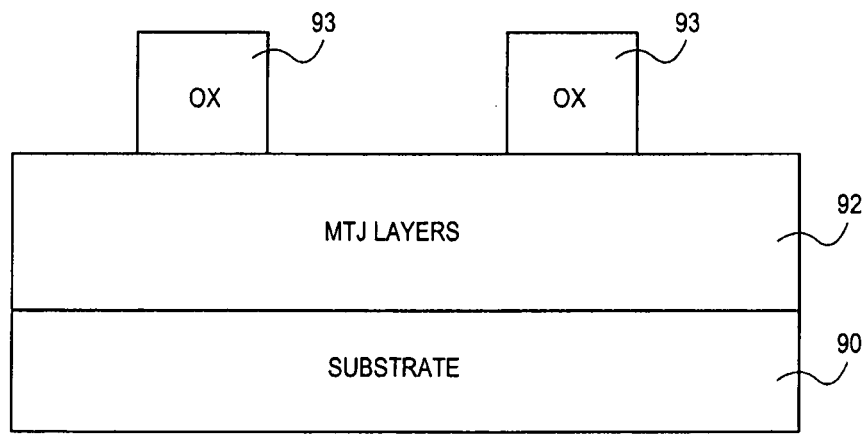
FIG. 17 is a cross-sectional, elevation view showing the formation of oxide members on MTJ layers.

FIG. 17 has a substrate 90 with overlying MTJ layers 92 used in the formation of the MTJ devices. Oxide masking members 93 of silicon dioxide or other material used in an ILD are photolithographically defined. The width of member 93 is equal to one dimension of the MTJ devices, and the pitch of member 93 is equal to the pitch of the array lines 89 of FIG. 16.

Figure 18:
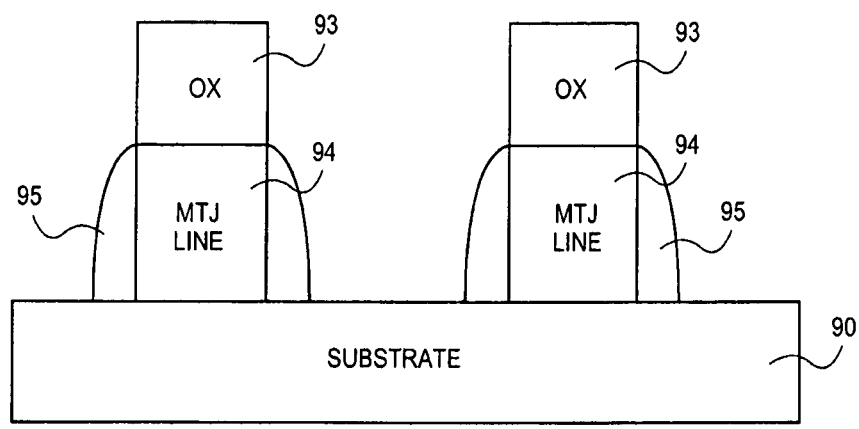
FIG. 18 is the structure of FIG. 17 following the etching of the MTJ layers to form MTJ array lines and the formation of protective spacers on the lines.
Figure 19:
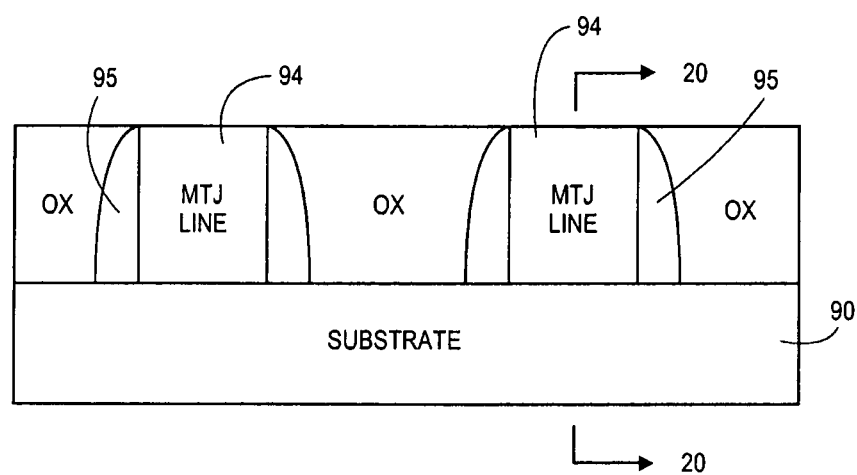
FIG. 19 illustrates the structure of FIG. 18 after the formation of an oxide layer and its planarization.

Now, as shown by FIG. 18, the MTJ layers 92 are etched, thereby defining elongated MTJ lines 94. Then, a conformal layer of, for example, silicon nitride is deposited and spacers 94 are formed along the edges of the lines to protect the edges during subsequent processing. Additionally, an oxide or ILD is formed over the structure of FIG. 18 and planarized to the tops of the elongated lines 94 as shown in FIG. 19. Thus, at this point in the processing, the elongated lines are formed, defining one dimension of the MTJ devices.

Figure 20:
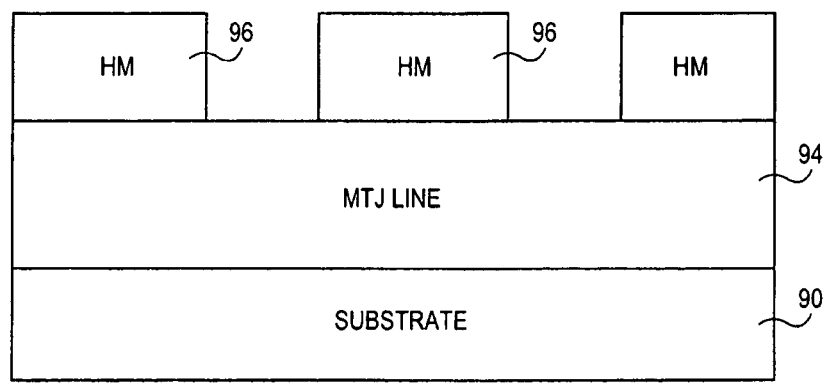
FIG. 20 shows the structure of FIG. 19 (through section line 20-20 of FIG. 19) and following the formation of hard masks used to define the second dimension of MTJ devices.
Figure 21A:
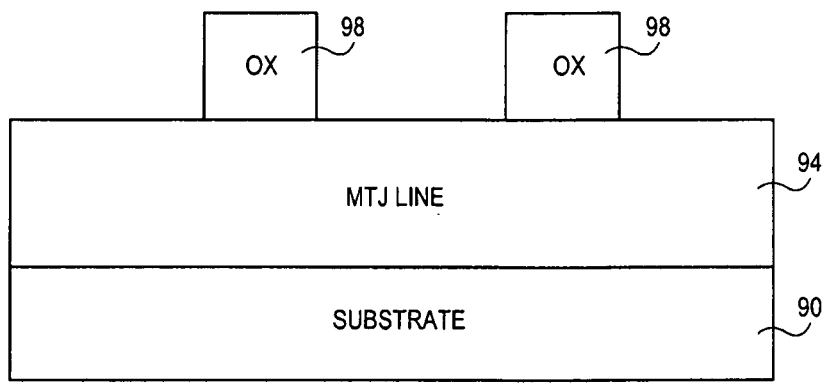
FIG. 21A is the structure of FIG. 20 after the formation of oxide masking members.

Referring now to FIG. 20, spaced-apart hard mask lines are lithographically defined on the upper surface of the structure of FIG. 19, orthogonal to the lines 96. (Note the cross-sectional view of FIG. 20 is taken through the section line 20-20 of FIG. 19.) Next, an oxide or ILD is deposited, planarized to the tops of the hard mask and the hard mask removed resulting in the oxide masking members 98 of FIG. 21A. The structure at this point of the processing is best seen in FIG. 21B where the oxide lines 98 and orthogonal MTJ lines 94 are clearly seen (without the spacers).

Figure 22:
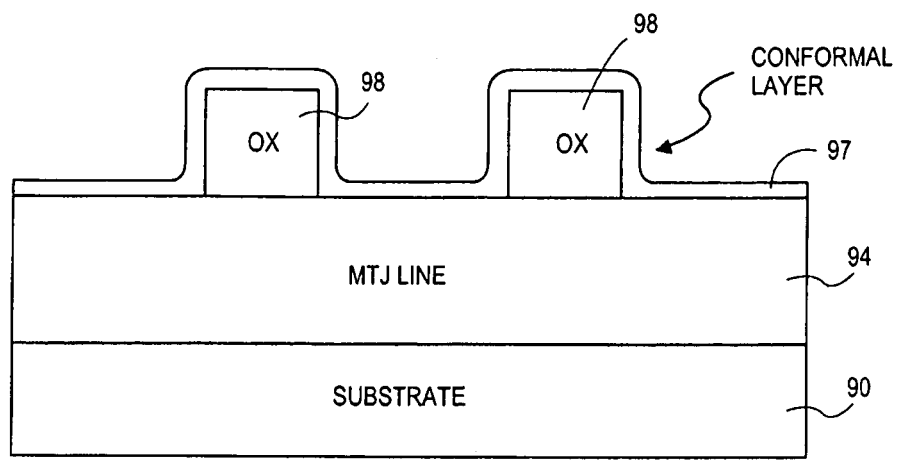
FIG. 22 illustrates the structure of FIGS. 21A and 21B following the formation of a conformal layer.
Figure 23:
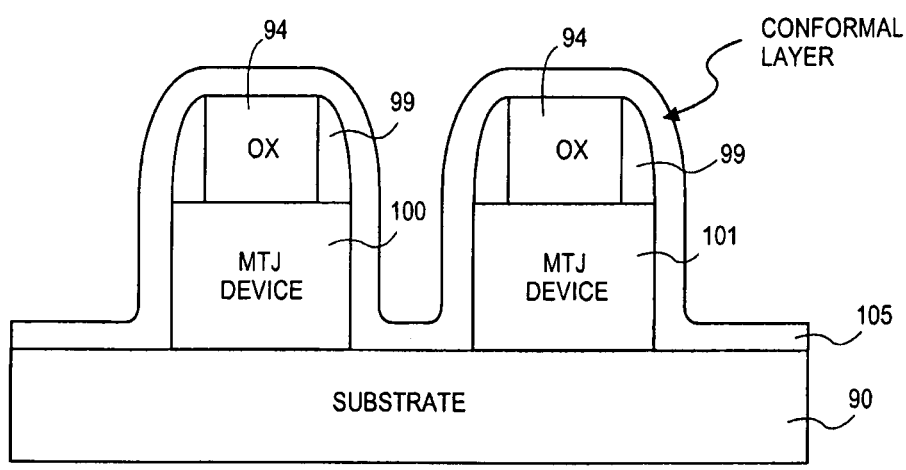
FIG. 23 illustrates the structure of FIG. 22 following the formation of spacers on the oxide members, the etching of the MTJ lines and the formation of a conformal layer.

As illustrated in FIG. 22, a conformal layer of, for instance silicon nitride, is deposited over the upper surface and anisotropically etched forming the spacers 99 of FIG. 23. Now, the MTJ lines are etched in alignment with the spacers 99 defining the second dimension of the MTJ devices 100 and 101 of FIG. 23. Another conformal layer 105 is deposited and etched resulting in the spacers 106 of FIG. 24A; these are protective spacers protecting the second edges of the MTJ devices.

Figure 24A:
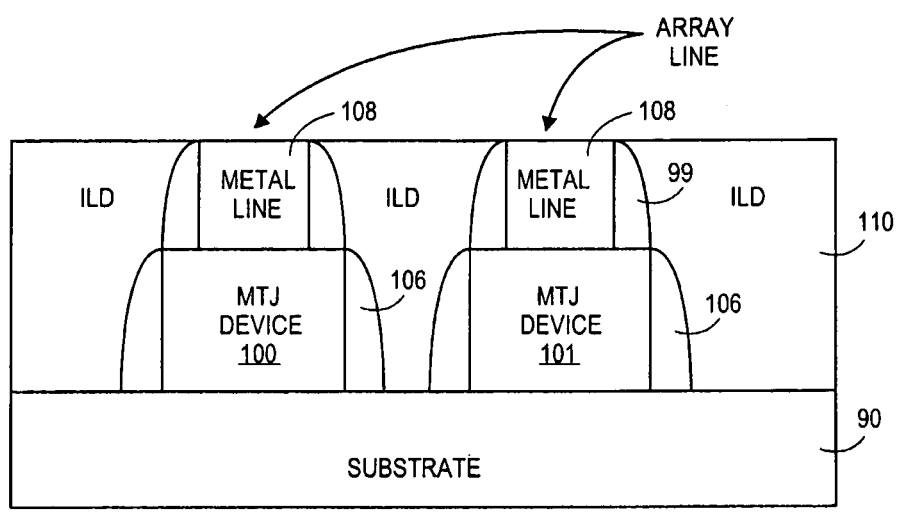
FIG. 24A illustrates the structure of FIG. 23 after the formation of protective spacers, the removal of the oxide masking members, and the formation of metal lines in an interlayer dielectric (ILD).
Figure 24B:
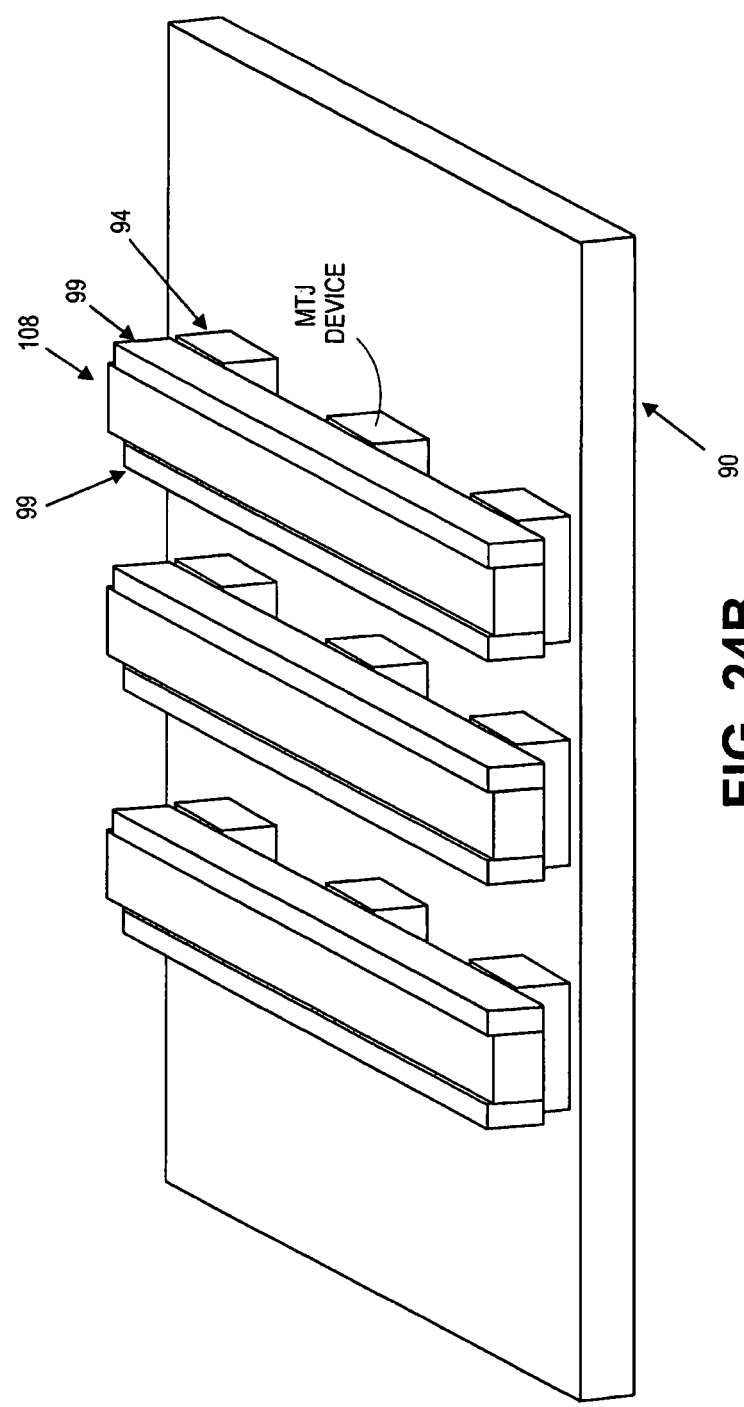
FIG. 24B is a perspective view of the structure of FIG. 24A.

Finally, an ILD layer 110 is deposited and polished back and after removal of the oxide members 98, metal lines 108 are formed making contact with the upper exposed regions of the MTJ devices, as shown in FIG. 24A. This point in the processing is better seen in the perspective view of FIG. 24B.

Figure 25:
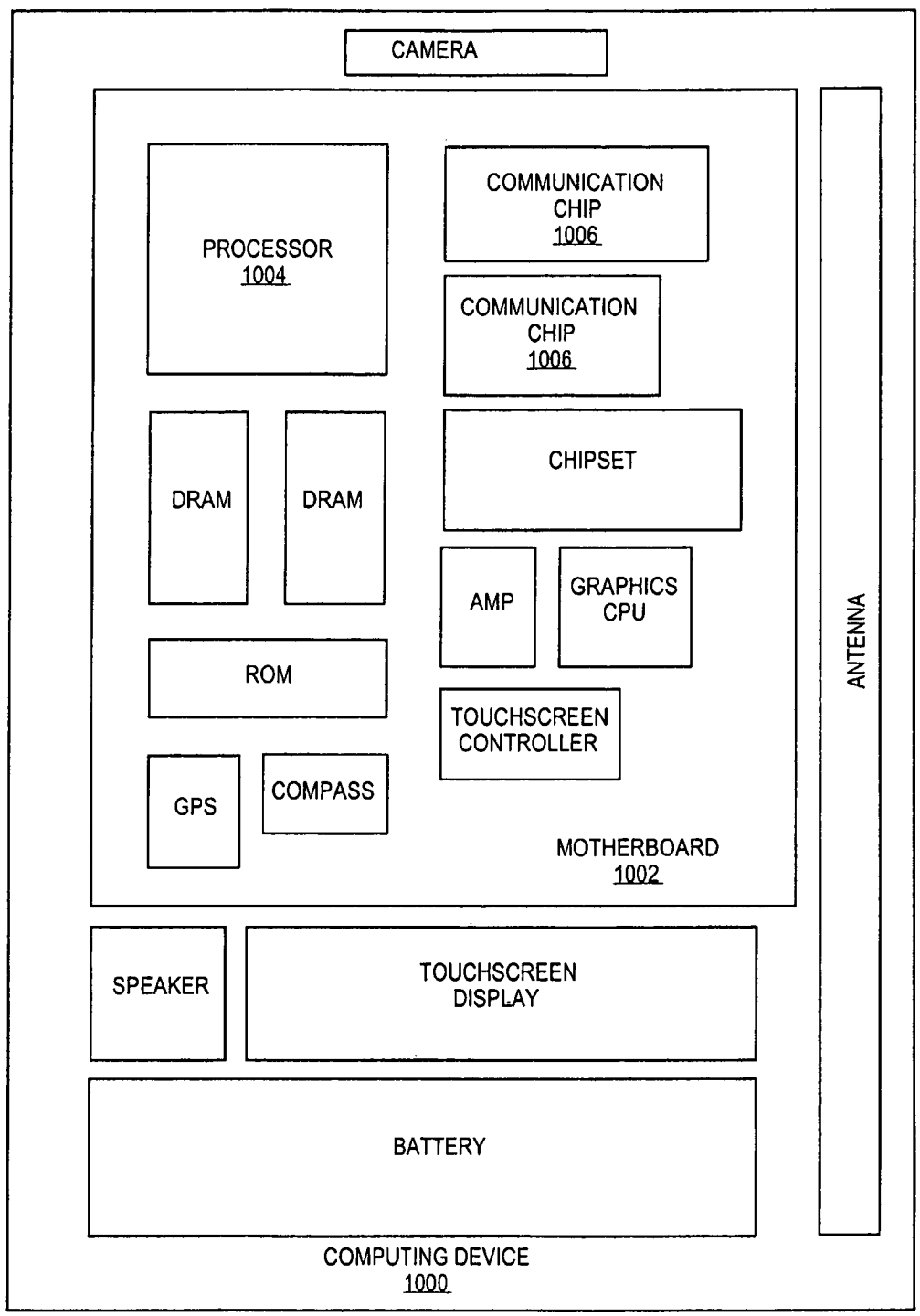
FIG. 25 is a block diagram of a computer system in which the described MTJ devices are used.

FIG. 25 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more memory elements that are formed in accordance with implementations of the present invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more memory elements that are formed in accordance with implementations of the present invention.

In further implementations, another component housed within the computing device 1000 may contain an integrated circuit die that includes one or more memory elements that are formed in accordance with implementations of the present invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Thus, several methods for fabricating contacts and lines of well-controlled size, precisely centered on the upper surface of MTJ devices, have been described.

What is claimed is:

1. A method for fabricating a contact on an upper surface of a memory device comprising: (a) forming a magnetic tunnel junction (MTJ) device over a substrate; forming a masking member on an upper surface of the MTJ device; depositing a dielectric layer surrounding the masking member and the MTJ device; planarizing the dielectric layer to expose the masking member; (b) removing the masking member thereby defining an opening in the dielectric layer exposing the upper surface the MTJ device; (c) depositing a conformal layer covering the upper surface of the MTJ device and sides of the opening; (d) anisotropically etching the conformal layer thereby forming a spacer lining each opening; (e) depositing a contact material into the opening and over the dielectric layer; and (f) polishing the contact material to remove the contact material from over the dielectric layer and to form a via from the contact material in the opening.

2. The method of claim 1, wherein the conformal layer comprises silicon nitride.

3. The method of claim 1, wherein the anisotropic etching is reactive ion etching.

4. The method of claim 1, wherein the conformal layer has a thickness of approximately 5-20 nm.

5. A contact on an upper layer of a magnetic tunneling junction (MTJ) device comprising: a metal contact disposed on the upper layer of an MTJ device, having a generally annular shape of uniform width, the contact being aligned with the edges of the upper layer.

6. The structure of claim 5, wherein the edges of the upper layer define a generally elliptical shape.

7. The structure of claim 6, wherein the width of the contact is between 5-20 nm.

* * * * *